United States Patent [19]

Frohman-Bentchkowsky et al.

[11] 4,203,158
[45] May 13, 1980

[54] ELECTRICALLY PROGRAMMABLE AND ERASABLE MOS FLOATING GATE MEMORY DEVICE EMPLOYING TUNNELING AND METHOD OF FABRICATING SAME

[75] Inventors: Dov Frohman-Bentchkowsky, Haifa, Israel; Jerry Mar, Sunnyvale, Calif.; George Perlegos, Cupertino, Calif.; William S. Johnson, Palo Alto, Calif.

[73] Assignee: Intel Corporation, Santa Clara, Calif.

[21] Appl. No.: 969,819

[22] Filed: Dec. 15, 1978

Related U.S. Application Data

[63] Continuation-in-part of Ser. No. 881,029, Feb. 24, 1978, abandoned.

[51] Int. Cl.² .............................................. G11C 11/40
[52] U.S. Cl. .................................. 365/185; 307/238; 357/41
[58] Field of Search ................ 365/185, 189; 307/238; 357/41, 45, 304

[56] References Cited

U.S. PATENT DOCUMENTS

| | | | |
|---|---|---|---|
| 3,500,142 | 3/1970 | Kahng | 365/185 |
| 4,051,464 | 9/1977 | Huang | 365/185 |

Primary Examiner—Terrell W. Fears
Attorney, Agent, or Firm—Blakely, Sokoloff, Taylor & Zafman

[57] ABSTRACT

An electrically programmable and electrically erasable MOS memory device suitable for high density integrated circuit memories is disclosed. Carriers are tunneled between a floating conductive gate and a doped region in the substrate to program and erase the device. A minimum area of thin oxide (70 Å–200 Å) is used to separate this doped region from the floating gate. In one embodiment, a second layer of polysilicon is used to protect the thin oxide region during certain processing steps.

16 Claims, 14 Drawing Figures

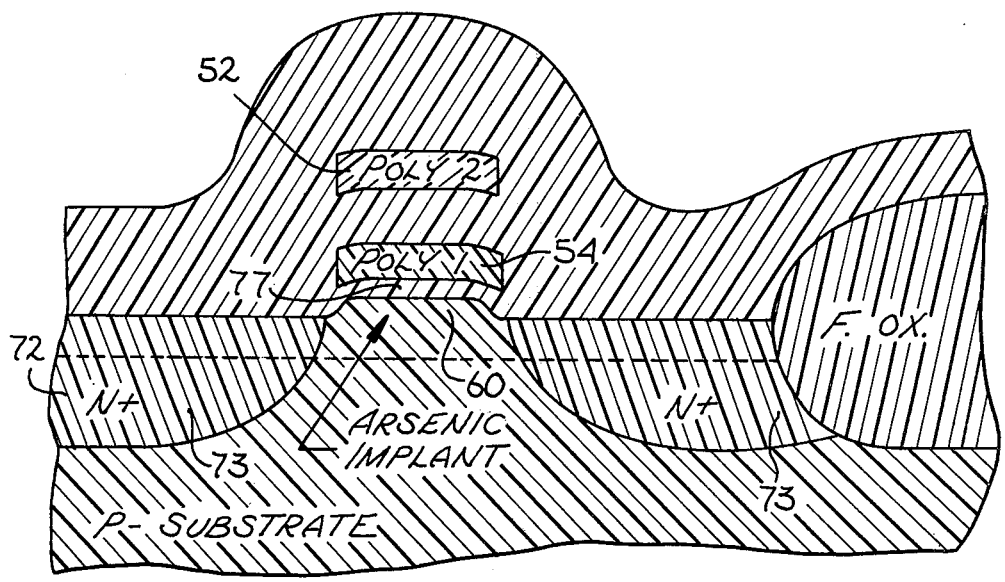
Fig. 7
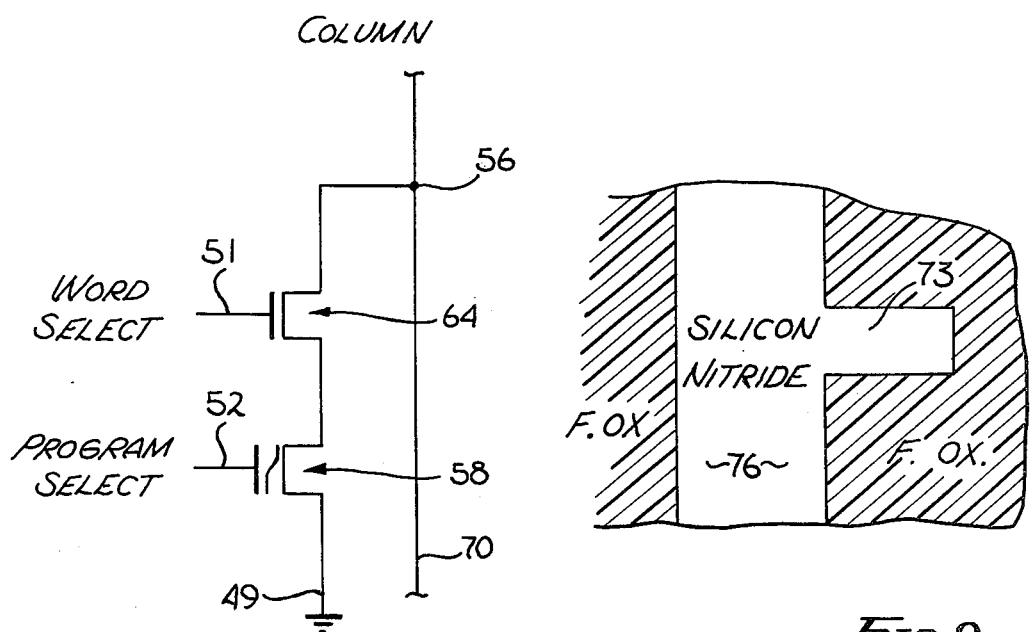
Fig. 8
Fig. 9

ELECTRICALLY PROGRAMMABLE AND ERASABLE MOS FLOATING GATE MEMORY DEVICE EMPLOYING TUNNELING AND METHOD OF FABRICATING SAME

CROSS-REFERENCES TO RELATED APPLICATIONS

This is a continuation-in-part application of Ser. No. 881,029, filed Feb. 24, 1978, now abandoned.

BACKGROUND OF THE INVENTION

1. Field of the Invention

The invention relates to the field of electrically alterable memory devices particularly those employing MOS floating gate structures.

2. Prior Art

Metal-oxide-semiconductor (MOS) floating gate devices are commonly employed in integrated circuit programmable read-only memories (PROMs). Typically, charge is transferred into an electrically isolated (floating) gate to represent one binary state while an uncharged gate represents the other binary state.

Perhaps the earliest reference to a floating gate device is found in U.S. Pat. No. 3,500,142 (Kahng device). In this device, a thin oxide of approximately 50 Å separates the entire active channel region from the floating gate. An overlying gate provides capacitive coupling to the floating gate allowing an electric field to be established across this thin oxide. Carriers are tunneled from the channel region into the floating gate to charge the gate. Because of the difficulties in fabricating reliable thin oxides over large areas, this device has never become commercially feasible.

The first commercial floating gate memories employed avalanche injection as a mechanism for transferring charge to the floating gate, thus allowing electrical programming. With the discovery of these FAMOS devices charge could be transported across relatively thick oxides (500 Å–1000 Å), thereby permitting the reliable fabrication of these devices. Such devices are disclosed in U.S. Pat. No. 3,660,819. Subsequently, "channel injection" again through a relatively thick oxide has been used for programming memory devices. For an example of this type of device see U.S. Pat. No. 3,996,657.

Currently floating gate memories are erased by exposing the array to radiation such as ultraviolet radiation. Numerous structures have been proposed for the erasing by an avalanche mechanism, however, none of these structures have performed very well. An example of one such device is shown in U.S. Pat. No. 3,797,000.

A number of memory devices have been disclosed in which carriers are tunneled through a relatively thick oxide (500 Å–1000 Å) for both programming and erasing. In some cases, textured gates are employed which provide an enhanced electric field. This field enables tunneling at lower potentials than would otherwise be necessary. One such device is disclosed in U.S. Pat. No. 4,099,196. None of these devices, thus far, have been used in a commercial memory. The device of the present invention is more like the Kahng device shown in U.S. Pat. No. 3,500,142 in that tunneling through a thin oxide is used rather than avalanche injection or channel injection. However, unlike the Kahng device, the thin oxide area constitutes only a small fraction of device area. The reduction of the thin oxide area greatly reduces the fabrication difficulties of the Kahng device where a thin oxide is employed over the entire channel region. Moreover, with the device of the present invention since programming and erasing occurs from an n-type region in the substrate (for an n-channel embodiment) only a positive power supply is required for both programming and erasing.

In *IEEE Journal of Solid State Circuits*, Vol. SC-12, No. 5, Oct. 1977 (pages 507–514), in an article entitled, "An 8192-Bit Electrically Alterable ROM Emphasizing a One-Transistor Cell with Floating Gate", a cell is described which employs a limited area of 400 Å–500 Å thick oxide for erasing. This device is programmed by avalanche injection and is reportedly erased by Fowler-Nordheim emission although a field of only $6.5 \times 10^6$ volts/cm is employed. As shown on Page 509 in FIG. 4, approximately 80 seconds is required for erasing (compared with 1 millisec. for the device of the present invention).

The only electrically erasable integrated circuit PROMs known to the applicant which are used in large quantities are those employing silicon nitride layers. These devices have shorter retention times than floating gate devices and in many cases they require both a positive and negative power supply. In some instances, only a single supply is required. However, in these cases, the memory cell area is substantially more than is required for memory cells fabricated in accordance with the present invention.

SUMMARY OF THE INVENTION

An electrically programmable and electrically erasable MOS memory device fabricated on a substrate of a first conductivity type is disclosed. The device includes a first and second spaced-apart region in the substrate of a second conductivity type. An electrically conductive, floating gate extends between these first and second spaced apart regions. This floating gate is insulated from the substrate by a first insulative layer. A third region of a second conductivity type is also included in the substrate. The floating gate extends over this region. A second insulative layer, 70 Å–200 Å thick insultes the floating gate from the third region. A second gate is formed above the floating gate and in insulated from the floating gate. When a first potential is applied to the second gate, carriers tunnel through the second insulative layer from the third region into the floating gate. By the application of the same polarity potential, carriers are removed from the floating gate by tunneling through the second insulative layer into the third region.

BRIEF DESCRIPTION OF THE DRAWINGS

FIG. 7 is a partial cross-sectional elevation view of the memory device of FIG. 6 taken generally through section line 7—7 of FIG. 5.

FIG. 8 is an equivalent circuit for one of the memory cells of FIG. 5.

FIG. 9 is a partial plan view of a substrate with a silicon nitride layer which is employed in the fabrication of the memory cells of FIG. 5.

DETAILED DESCRIPTION OF THE INVENTION

An electrically programmable and electrically erasable metal-oxide-semiconductor (MOS) memory device is disclosed. In the following description, numerous specific details are provided such as specific dopants and concentration levels, etc., in order to provide a thorough understanding of the invented device. It will be obvious to one skilled in the art, however, that the invention may be practiced without these specific details. In other instances, well-known processing steps are not described in detail in order not to obscure the invention in unnecessary detail. The presently preferred embodiment of the invention is an n-channel device, and thus, the following description is directed only to an n-channel device. It will be obvious to one skilled in the art that a p-channel embodiment may be fabricated.

Figure 1:
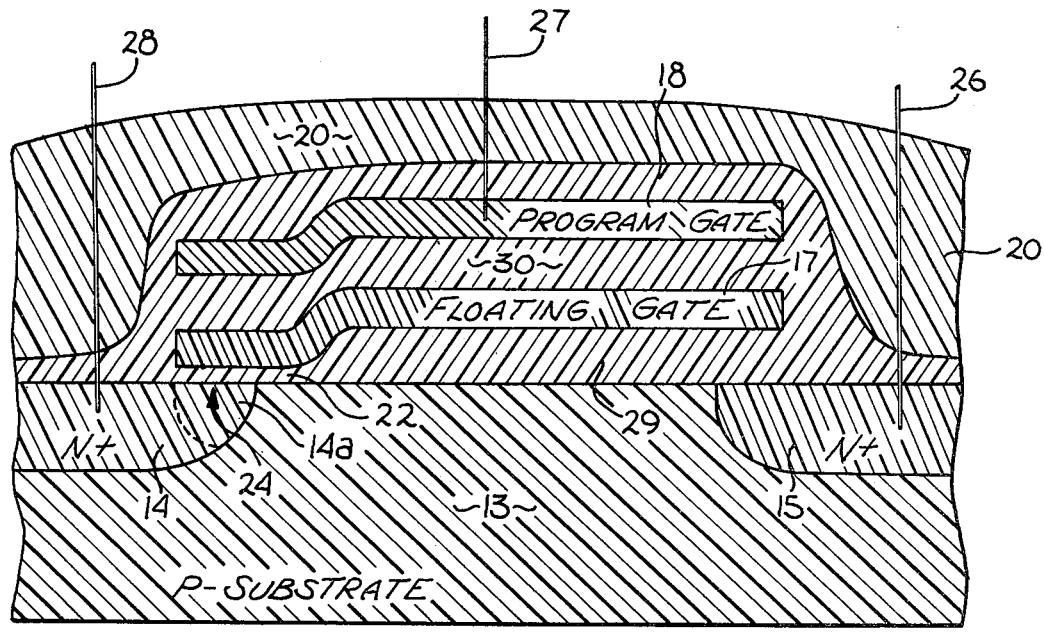
FIG. 1 is a cross-sectional elevation view of a memory device formed in accordance with the present invention.

Referring first to the cross-sectional elevation view of FIG. 1, the memory device is fabricated on a p-type silicon substrate 13. The device includes a pair of spaced-apart n-type regions 14 and 15. For purposes of discussion, it will be assumed that region 14 is a source region while region 15 is a drain region. A electrically floating polycrystalline silicon (polysilicon) gate 17 is formed above the channel defined by the source and drain regions. This gate is completely surrounded by oxide ($SiO_2$) so that once charge is transferred into this gate it remains in the gate. A second gate identified as a program gate 18 is disposed above the floating gate 17 and insulated therefrom by an oxide layer 30. A protective layer such as a glass layer 20 is formed above the entire memory device as is well-known in the art. Metal contacts or buried contact regions are not illustrated for the devices of FIGS. 1 and 2; however, lines are shown contacting the source and drain region and the gate 18 to show that electrical contact is made to these regions and the gate 18. Specifically, line 28 is connected to the source region 14, line 27 to the gate 18, and line 26 to the drain region 15.

The floating gate 17 for most of the channel defined between the source and drain regions is separated from the substrate by an oxide layer 29 of between 500 Å–1000 Å thick. A much smaller area of the floating gate 17 is separated from the substrate by a second oxide layer 22. This thinner second oxide layer is between 70 Å–200 Å thick. The second oxide layer 22 extends over a third n-type region 14a which for the embodiment of FIG. 1 is contiguous with the source region 14. In the overlapping area 24, the floating gate 17 is separated from the third region 14a by approximately 70 Å–200 Å of oxide. The oxide layer 30 is between 500 Å–1000 Å thick.

The memory device of FIG. 1 may be fabricated employing well-known silicon gate technology. An extra masking step is required for the embodiment of FIG. 1 to define the thin oxide layer 22. In one embodiment after the thicker gate oxide 29 is grown, a slot is formed above the overlap area 24. The slot is used to diffuse or implant an n-type dopant into the third region 14a and to define the thin oxide layer 22. Slotting techniques are described in U.S. Pat. No. 4,053,340. A separate doping step to define the third region 14a may be avoided by causing sufficient lateral diffusion from the source region 14 to provide the necessary overlap 24. In this case the third region 14a is contiguous with the source region 14 and integral with this region.

In the preferred embodiments the floating gate and the program gate 18 are polysilicon members in general vertical alignment with one another, particularly at the channel edges.

To program the device of FIG. 1, that is, to place a charge on the gate 17, a positive potential of approximately 20 volts is applied to line 27 while lines 26 and 28 are grounded. This potential provides an electrical field across the thin oxide 22 of sufficient magnitude to tunnel electrons from the region 14a to the conductive floating gate 17. (Some electrons will come from the substrate under the thin oxide which surrounds the region 14a.) Sufficient capacitive coupling exists between the gates 17 and 18 such that most of the electric field associated with the potential applied to the gate 18 occurs across the thin oxide layer 22. Once electrons have been tunneled into the gate 17, the threshold voltage of the memory device becomes more positive.

To erase the memory device of FIG. 1, a positive potential of approximately 20 volts is applied to the source region 14 while the program gate 18 is grounded. The electric field across the thin oxide layer 22 is sufficient to cause the tunneling of electrons from the gate 17 into the third region 14a through the thin oxide layer 22. When charge is removed from the gate 17, the threshold voltage of the memory device is lowered. A potential need not be directly applied to the source region or third region 14a for erasing. A conductive path from the drain region 15 may be obtained to the regions 14 and 14a by a punch-through condition or a transient inversion layer.

The state of the memory device may be sensed when a potential (+5 volts) is applied to the gate 18 by detecting current flow between the source and drain regions.

The memory device of FIG. 1 and the other embodiments described in this patent have the advantage that only a relatively small thin oxide area is required within each memory device. An overlap between the floating gate 17 and the region 14a of approximately 1 to 10 $microns^2$ is sufficient to allow the electrons to be transported through the thin oxide without substantial damage to this oxide. This oxide can tolerate $10^4$–$10^6$ programming cycles without affecting the performance of the memory device. The thin oxide layer 22 is sufficiently thick, however, to prevent slow deprogramming of the floating gate 17. Retention times of 100 yrs. have been projected based on accelerated, high temperature testing. With the device of FIG. 1, particularly because of the third region 14a, the device may be both programmed and erased through the substrate with the same polarity potential without isolation.

Figure 2:
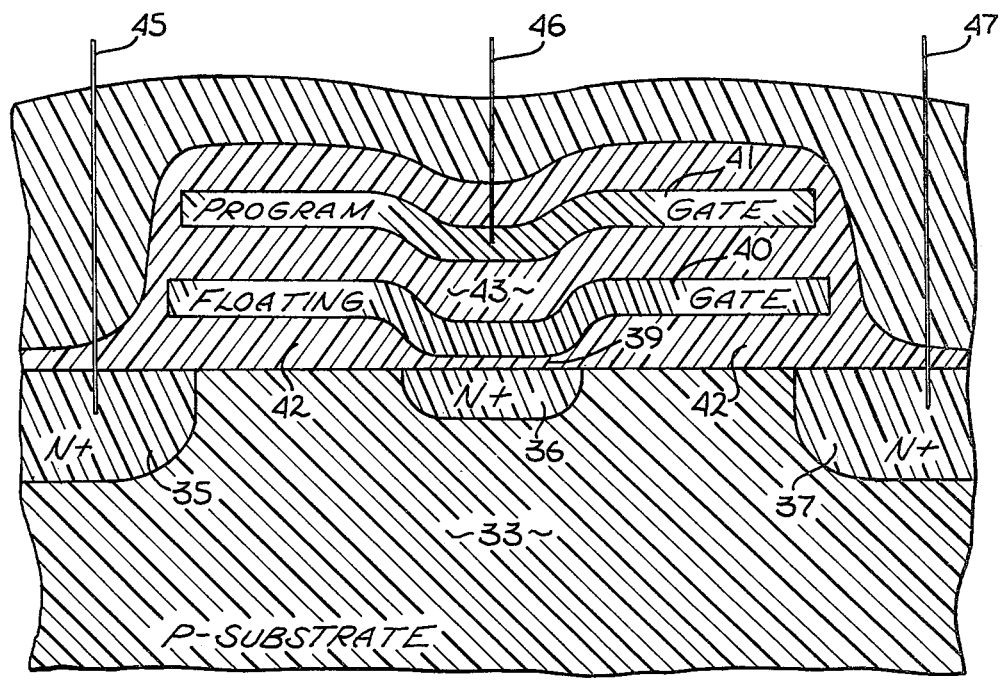
FIG. 2 is a cross-sectional elevation view of an alternate embodiment of the memory device of FIG. 1 wherein the third region is isolated from the first and second regions.

Referring now to FIG. 2, the alternate embodiment of the device of FIG. 1 is shown fabricated on a p-type silicon substrate 33. This memory device again includes a pair of spaced-apart, n-type regions 35 and 37 which correspond to regions 14 and 15, respectively of the device of FIG. 1. A third n-type region 36 is disposed in the channel defined between regions 35 and 36. The region 36 of the device of FIG. 2 corresponds to the region 14a of the device of FIG. 1. A conductive floating gate which in the preferred embodiment is polysilicon is disposed above and insulated from the channel. This gate is separated from the third region 36 by an oxide layer 39 which is 70 Å–200 Å thick. The remainder of the floating gate 40 is separated from the channel by an oxide layer 42 which is 500 Å–1000 Å thick. The program gate 41 as in the embodiment of FIG. 1, is disposed above gate 40 and insulated from gate 40 by an oxide layer 43 which is approximately 1000 Å thick. Contact to the source region 35 is shown in this embodiment by line 45, with the program gate by line 46, and with the drain region 37 by line 47.

The device of FIG. 2 may be fabricated in a similar manner to the device of FIG. 1. A slot may be employed to define the third region 36 and the thin oxide layer 39.

Charge is transferred from the third region 36 and the immediately surrounding substrate into the floating gate 40 by the application of a positive potential of 20–25 volts to the program gate 41 while the source and drain regions 35 and 36 are grounded. Erasing occurs when the drain region is positive relative to the program gate 41 and source region 35. A positive potential of approximately 18 volts at region 37 is sufficient to cause electrons to tunnel from the floating gate 40 through the thin oxide layer 39 into the region 36. Lateral transport by means of punch-through or injection between the drain and third region 36 is used to charge region 36. Thus the region must be aligned with the source and drain regions to provide a conductive path to region 36.

Figure 3:
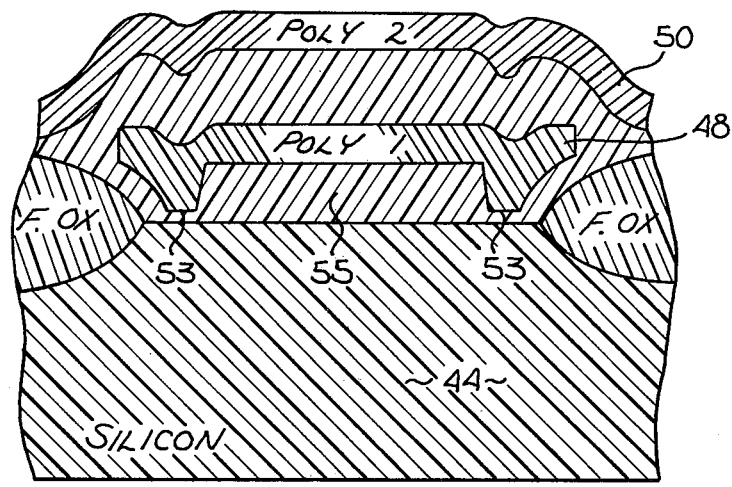
FIG. 3 is a cross-sectional elevation view of an alternate embodiment of the memory device of FIG. 1 where the thin oxide regions extend between the source and drain regions.
Figure 4:
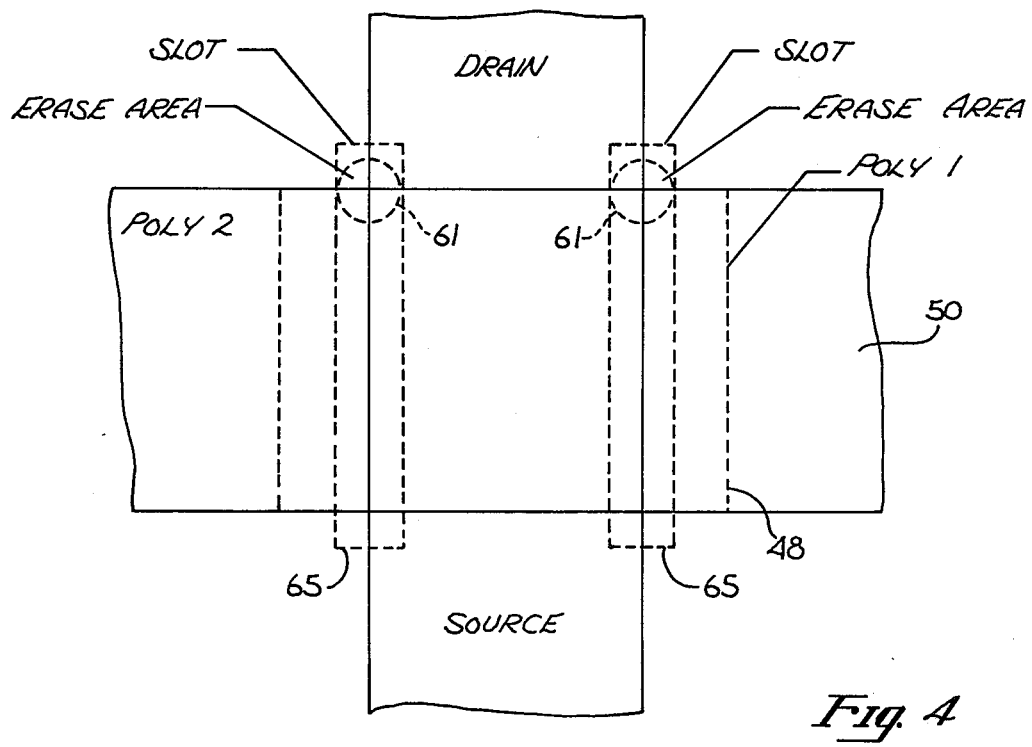
FIG. 4 is a plan view of the device of FIG. 3.

Referring now to FIGS. 3 and 4, in the embodiment of these figures, the thin oxide layer extends between the source and drain regions along the sides of the active channel region. The floating gate 48, which is formed from the first layer of polysilicon, is separated from this channel by a gate oxide layer 55 which is between 500 Å–1000 Å thick. Along the sides of the channel, a thinner oxide layer 53 (70 Å–200 Å thick) separates this floating gate from the substrate. The extent of this thin oxide layer 53 is shown by the general dotted lines 65 of FIG. 4. In this embodiment, the program gate 50 is defined by an elongated polysilicon line, best shown in FIG. 4. As in the previous embodiments, the program gate is separated from the floating gate by an oxide layer which is approximately 1000 Å thick. An erase area or overlap area occurs in the general area 61 where the floating gate 48 extends over the drain region. Thus, programming and erasing of the floating gate, for this embodiment, is similar to the embodiment of FIG. 1.

This embodiment has the advantage that the slot used to define the thin oxide layer 53 may be formed as part of standard processing steps used to fabricate the memory device. During the fabrication of the memory device, the sides of the channel are defined by the field oxide (FOX) shown in FIG. 3. The limits of this field oxide, as is well-known, may be determined by employing a silicon nitride layer. The silicon nitride layer is formed with an overlying mask such as an oxide masking layer. After the field oxide is grown, the silicon nitride layer is laterally etched between the masking oxide layer and gate oxide layer. In this manner, two elongated narrow slots are defined which extend between the source and drain regions in a general area shown by the dotted lines 65 of FIG. 4. Once the underlying gate oxide is exposed, it may be etched and the thinner oxide layer 53 grown within the slots. Thus, with this embodiment, the slots used to define the thin oxide are easily formed.

The devices of FIGS. 1 through 4 may be incorporated into memory cells and employed in electrical alterable PROMs. Depending upon the configuration of the memory, selection devices or isolation devices may be required in series with each of the memory devices of FIGS. 1 through 4 to form a memory cell. For the embodiment of FIG. 5 as will be described, a selection device is fabricated with each of the memory devices to form memory cells.

Referring first to FIG. 8, each of the memory cells includes a memory device such as device 58 and a field-effect transistor such as transistor 64 which allows selection of the memory device. The transistor 64 and device 58 are coupled in series between a column line in the array such as line 70, and a ground line or region 49. A metal contact 56 connects the drain terminal of the transistor 64 with the column line 70. The gate of the selection transistor 64 is coupled to a word select line 51. The gate of the memory device 58 is coupled to a program select line 52.

Figure 5:
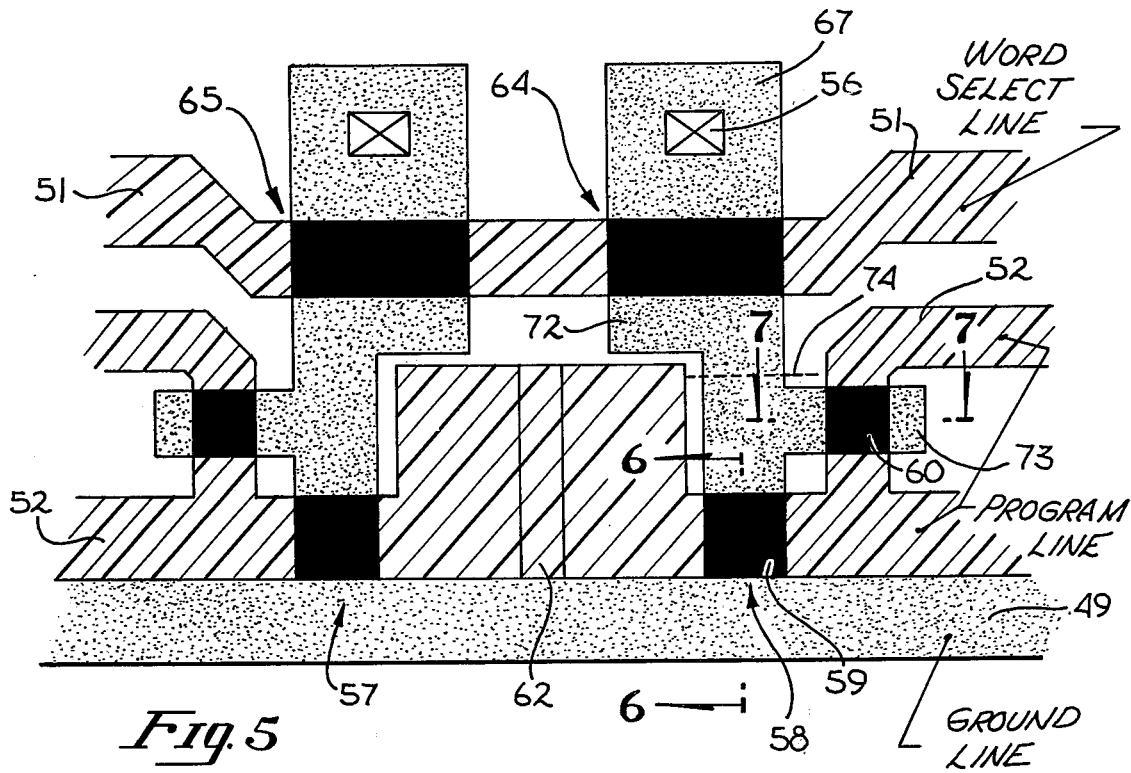
FIG. 5 is a plan view of a pair of memory cells in accordance with the presently preferred embodiment of the present invention, except for the improvement of FIGS. 13 and 14.

In FIG. 5, the presently preferred layout for a pair of identical (mirror image) memory cells is shown, except for the "blanket" used over the floating gate at the region of the thin oxide, as will be described in detail in conjunction with FIGS. 13 and 14. One of the memory cells includes the transistor 64 and the memory device 58. The other includes a selection transistor 65 and a memory device 57. The metal contact 56 of FIG. 8 is shown in the drain region 67 of the transistor 64 in FIG. 5. The word select line 51 is an elongated polysilicon member as shown in FIG. 5 which defines the gates of the transistors 64 and 65. The program select line 52 and the ground region 49 (which defines the source regions for the memory devices) are also shown in FIG. 5 to provide a correlation between FIGS. 5 and 8.

In FIG. 5 for purposes of explanation, doped regions in the substrate have been shown as dotted areas, polysilicon members as cross-hatch areas, and channel regions and thin oxide areas as clear areas.

Figure 6:
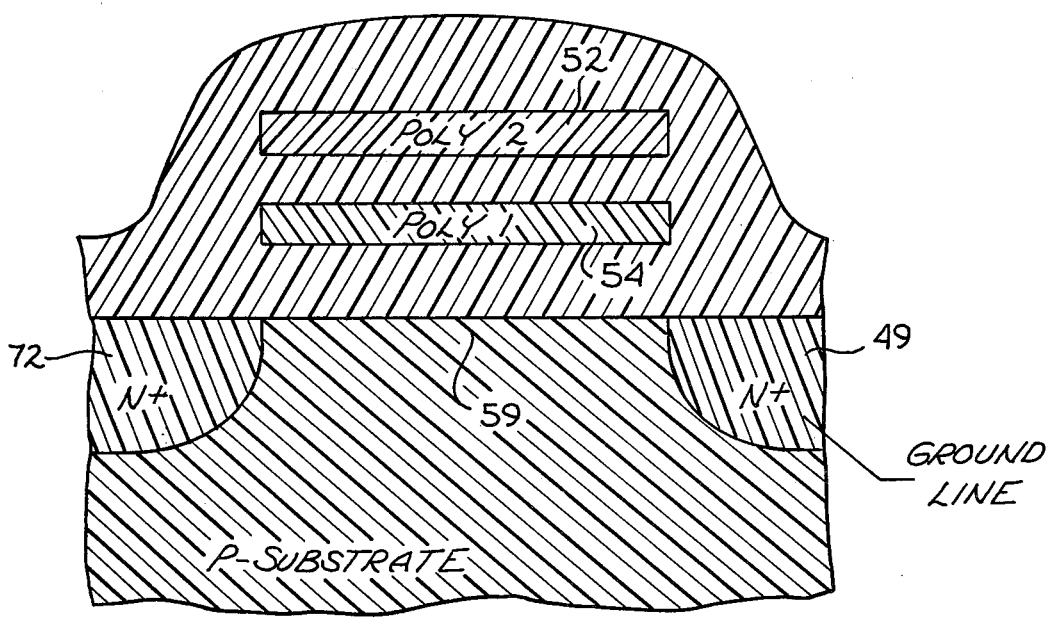
FIG. 6 is a partial cross-sectional elevation view of one of the memory devices of FIG. 5 taken generally through section line 6—6 of FIG. 5.
Figure 10:
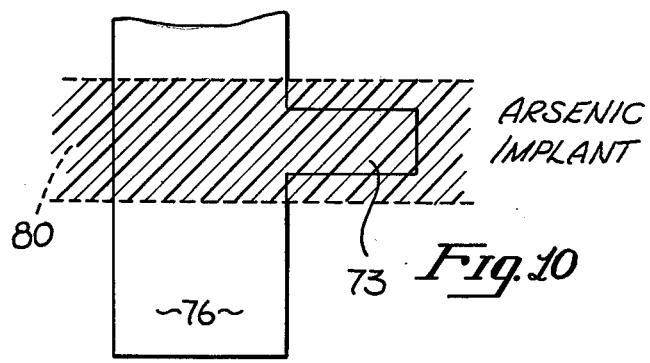
FIG. 10 is a plan view of the portion of the substrate of FIG. 9 with an ion implanted region.

The diffused region 72 is a source region for the selection transistor 64, and also a drain region for the memory device. The source region for the memory device is the elongated ground line or diffusion 49, as mentioned. As is best illustrated in FIG. 6 the channel 59 is disposed between the source and drain regions. The first level and second level polysilicon layers are disposed above this channel. The first layer of polysilicon defines the polysilicon floating gate 54. The second layer of polysilicon defines the second gate (program gate) for the memory device, this gate is integral with the program line 52. The first layer and second layer of polysilicon are vertically aligned at the ends of the channel 59 as shown in FIG. 6. A window 62 (FIG. 5) is defined in the lower layer of polysilicon between the memory cells of FIG. 5 to provide a separate floating gate for each memory device.

The region 72 includes a laterally extending finger 73. Both the first level and second level polysilicon members extend across this finger at region 60. Referring also to FIG. 7, in this cross-sectional view, the finger 73 is illustrated extending from the region 72. A portion of the floating gate 54 is disposed above and insulated from the third region 60. The program gate 52 is disposed above and insulated from the floating gate.

The memory device 58 of FIGS. 5, 6, 7 and 8, is similar in operating principle and in design to the memory device of FIG. 1. The floating gate 54 is separated from the source and drain regions at the channel 59 by an oxide layer which is approximately 500 Å–1000 Å thick. The second gate is separated from the floating gate by an oxide layer of approximately 1000 Å. At the third region 60 best shown in FIG. 7, the floating gate is separated from region 60 by an oxide layer 77 which is approximately 100 Å thick. This third region corresponds to the region 14a of FIG. 1.

In FIGS. 9 through 12, several of the processing steps used in the fabrication of the memory device of FIG. 5 are illustrated. The processing steps below the dotted line 74 of FIG. 5, which primarily includes the memory device 58 (not the selection transistor) are shown in FIGS. 9 through 12.

In the fabrication of the memory device, well-known "front-end" steps are employed to form a field oxide (F.OX.) on selected portions of the substrate. A silicon nitride layer 76 (FIG. 9) which is defined by a masking step is used to prevent the growth of the field oxide in this region as shown in FIG. 9. The layer 76 includes the lateral extending finger 73.

After the removal of the silicon nitride layer 76, another masking step, not illustrated, occurs. In this masking step, a region corresponding generally to the channel 59 shown in FIGS. 5 and 6 is masked to allow ion implantation of this channel. This implantation is used to adjust the threshold voltage of the memory device. In the presently preferred embodiment, the memory device has a threshold of approximately +2 volts prior to the time that any programming or erasing occurs. When charge is tunneled onto the floating gate, the device has a threshold voltage of approximately +8 volts. When charge is removed from the floating gate, the memory device has a threshold voltage of approximately −2 volts. The +2 volts threshold voltage only occurs in a "virgin" device; this threshold voltage is not employed in actual use.

After the growth of a gate oxide, another masking step is employed to define the region 80 which includes the finger 73. After removal of the gate oxide in region 80, this region is ion implanted. In the presently preferred embodiment, an arsenic implant (AS$_{75}$) to a level of $5 \times 10^{13}$/cm$^2$ is employed. It is this implantation which is used to define the third region 60. Tunneling of the electrons to and from the floating gate primarily occurs through this region. After the implantation the thin oxide layer (100 Å) is grown employing a double (HCl) grown oxide process.

Figure 11:
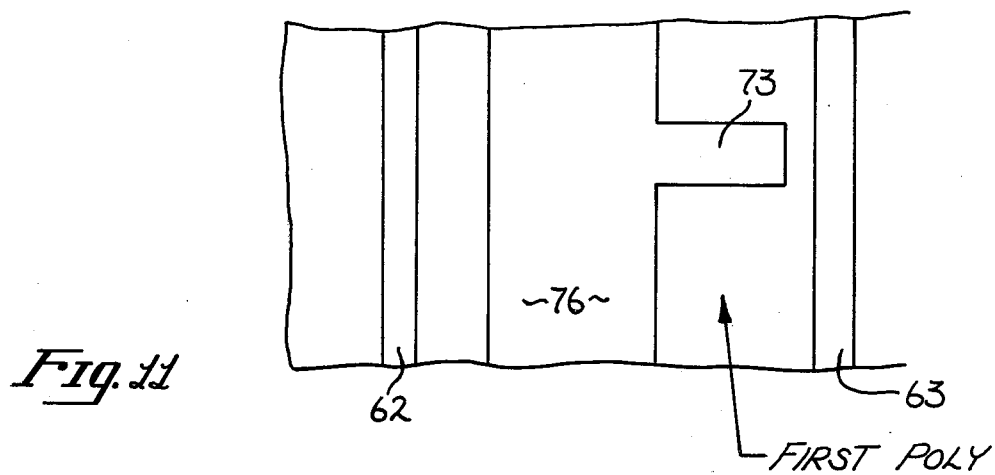
FIG. 11 is a plan view of the portion of the substrate of FIG. 10 after a first polysilicon layer has been formed on the surface of the substrate.

Following this, a first polysilicon layer is formed on the substrate (FIG. 11.) Masking and etching steps are employed to define window 62 and 63. These windows are used to form breaks in the first polysilicon layer so that each of the floating gates formed from this layer are separated. The window 62 is also shown in FIG. 5, as mentioned.

When the memory devices are fabricated on a substrate which includes peripheral circuits (such as is normally done for a PROM), a number of other processing steps occur which are unrelated to the memory device. For example in the presently preferred embodiment, a number of masking and diffusion steps occur to define host regions for enhancement mode and depletion mode transistors. The formation of these host regions is described in U.S. Pat. No. 4,052,229. Also a masking step occurs in the peripheral circuits to define buried contact regions.

After these additional steps an oxide of approximately 1000 Å is formed on the first polysilicon layer and then a second polysilicon layer is deposited on this oxide layer. A masking step is employed to define the pattern for the gate/line 52 shown in FIG. 12. Once this pattern is defined in the upper layer of polysilicon, the oxide below this layer and the lower layer of polysilicon are etched in alignment with this upper polysilicon layer. The process employed in the presently preferred embodiment for etching the lower layer of polysilicon in alignment with the upper layer is described in copending application now U.S. Pat. No. 4,142,926 Ser. No. 771,521, filed Feb.24, 1977, entitled "Self-Aligning Double Polycrystalline Silicon Etching Process," and assinged to the assignee of this application.

Next, an arsenic dopant is employed to form the source and drain regions including regions 49, 67, and 72. Well-known steps are then used to form metal contacts such as the contact 56 of FIGS. 5 and 8, and the overlying metal lines such as the column line 70 of FIG. 8.

In the presently preferred embodiment, where each memory cell includes a field-effect transistor and a memory device an area of less than 600μ$^2$ (one mil$^2$) is required for each cell. The thin oxide overlap area consists of an area of 1 to 10 microns$^2$.

Referring to FIGS. 5 through 8, assume that it is necessary to program (charge) the floating gate 54. The region 49 shown as the ground line in FIG. 8 is coupled to ground. The region 72 is also coupled to ground through the selection transistor 64. A positive potential of 18 to 24 volts is then applied to the program line 52. This potential is large enough to cause tunneling through the thin oxide separating the third region 60 from the floating gate. Thus, charge is transferred through the thin oxide layer 77 into the floating gate. As previously mentioned, once the floating gate is charged, the threshold voltage of the device is approximately +8 volts.

To erase the floating gate a positive potential of 18 to 24 volts is applied through transistor 64 to the region 72. The transistor 64 is turned-on hard enough to allow this potential to be transferred to the region 72. Since region 72 is contiguous with the third region 60, this potential develops an electric field across the thin oxide layer 77 separating the third region 60 from the floating gate (assuming line/gate 52 is grounded). Electrons then tunnel through the thin oxide layer 77 into the region 60. The threshold voltage in this erased condition is approximately −2 volts, as mentioned (with source region floating).

Referring briefly to FIG. 7, it has been found that a deterioration in the thin oxide layer 77 occurs at the edges of the floating gate 54 during the processing steps associated with the formation of the source and drain regions, such as region 73. Apparently, during the reoxidation steps used after the diffusion of the dopant into the substrate, the integrity of the oxide, particularly at the edges of the floating gate, is weakened. This lowers the number of possible programming/erasing cycles for the device.

This problem has been solved with a modification to the embodiment shown in FIGS. 5 through 12. In general, as shown in FIGS. 13 and 14, this modification consists of a "blanket" formed over the edges of the floating gate at the region of the thin oxide to protect the thin oxide during the doping and reoxidation. In the presently preferred embodiment, this blanket is formed from the second layer of polysilicon and is an extension of the control gate.

Figure 12:
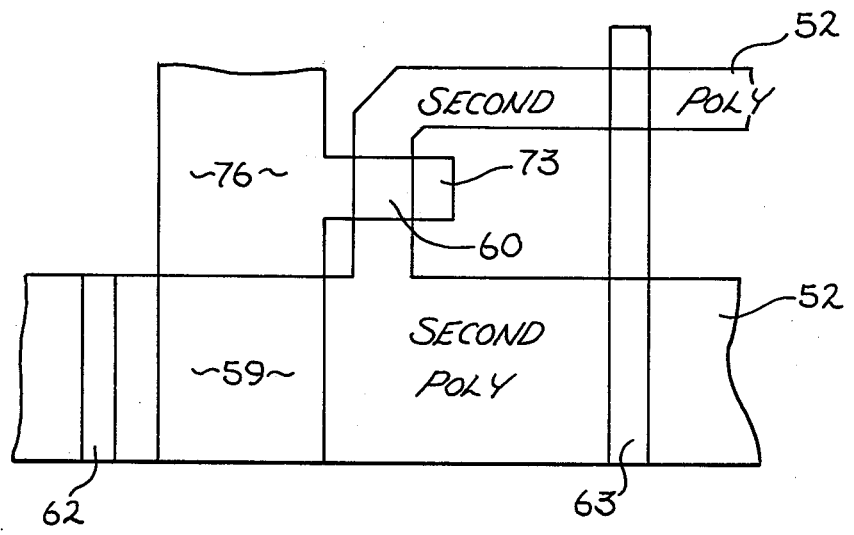
FIG 12 is a plan view of the general portion of the substrate of FIG. 11 after a second layer of polysilicon has been formed and after additional masking and etching.
Figure 13:
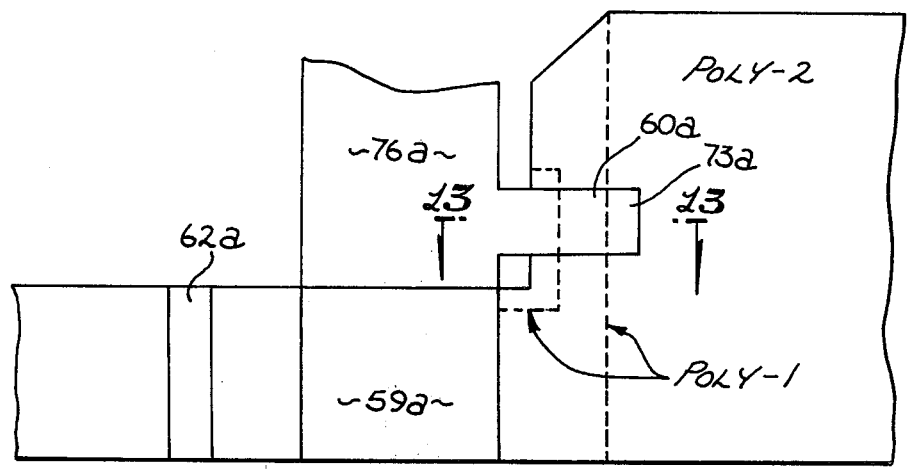
FIG. 13 is a partial plan view similar to the view of FIG. 9 except with a polysilicon "blanket" used over the floating gate in the region of the thin oxide.

FIG. 13 illustrates the step in the processing which corresponds to the step shown in FIG. 12. The cross-sectional view corresponding to the view of FIG. 7 is shown in FIG. 14. In FIGS. 13 and 14, like regions, layers, etc. are shown by the corresponding numbers used in FIGS. 7 and 12, however with the letter "a" added. Referring first to FIG. 13, the first layer of polysilicon is etched prior to the formation of the second layer of polysilicon, particularly in the region of the finger 73a, such that the floating gate formed from this layer is spaced apart from the edges of the finger 73a as shown by the dotted line in FIG. 13. After the etching of the first layer of polysilicon in this manner and the formation of an oxide layer, the second layer of polysilicon is formed above the first layer and etched as shown in FIG. 13. As described above, the second layer of polysilicon is used as a mask to etch the first layer of polysilicon in alignment with the second layer, except in the area shown by dotted lines in FIG. 13.

Figure 14:
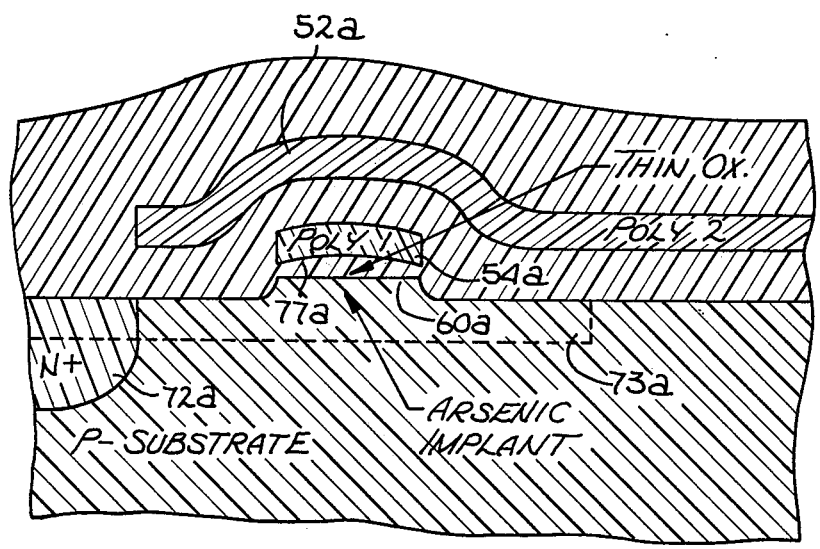
FIG. 14 is a partial cross-sectional elevation view of the embodiment of FIG. 13 taken generally through the section line 13—13 of FIG. 13.

The resultant structure is best shown in FIG. 14. The gate 52a forms a cover or blanket over the floating gate 54a, particularly in the region of the thin oxide 77a. The gate 52a extends beyond the edges of the floating gate 54a. In this manner, the subsequent steps, such as the doping step used to form the region 72a and the subsequent reoxidation, occur apart from the edges of the floating gate 54a, which are above the thin oxide. In other respects, the floating gate device of FIGS. 13 and 14 is the same as the device of FIGS. 5 through 12.

In actual tests, it has been found that by employing the "blanket" over the floating gate as shown in FIG. 14, a substantial increase in the possible number of programming/erasing cycles is obtained.

Thus, a memory device has been described which can be electrically programmed and electrically erased with a single polarity potential. Tunneling is employed for transporting charge into and from an electrically isolated floating gate through a thin oxide. A relatively small area of thin oxide per memory device is employed, particularly when compared to prior art devices, making the memory device of the present invention relatively easy to fabricate.

We claim:

1. An electrically programmable and electrically erasable MOS memory device comprising:
    a substrate of a first conductivity type;
    first and second spaced-apart regions in said substrate of a second conductivity type;
    an electrically floating, conductive gate disposed generally between said spaced-apart first and second regions;
    a first insulative layer insulating said floating gate from said substrate;
    a thin region in said substrate of said second conductivity type;
    said floating gate extending over said third region and insultated from said third region by a second insulative layer which is 70 Å to 200 Å thick;
    a second gate disposed above and insulated from said floating gate;
    whereby, by the application of a first potential to said second gate, carriers are tunneled through said second insulative layer from said third region into said floating gate, and whereby, by the application of a second potential of the same polarity as said first potential to said third reigon, carriers are tunneled through said second insulative layer from said floating gate to said third region.

2. The MOS memory device defined by claim 1 wherein said first and second insulative layers are oxide layers.

3. The MOS memory device defined by claim 2 wherein said third region is contiguous with one of said first and second regions.

4. The MOS memory device defined by claim 2 wherein said third region is an electrically isolated region in said substrate aligned with said first and second regions such that an electrical path exists to said third region during a punchthrough condition between said first or second and third regions.

5. The MOS memory device defined by claim 2 wherein said second conductivity type is n-type.

6. The MOS memory device defined by claim 5 wherein said floating gate and said second gate are polycrystalline silicon members.

7. The MOS memory device defined by claim 6 wherein said first insulative layer is between 500 Å–1000 Å thick.

8. The MOS memory device defined by claim 1 wherein said second gate extends beyond the edges of said floating gate at said third region.

9. An MOS memory device fabricated on a p-type silicon substrate comprising:
    a first and second spaced-apart, n-type region in said substrate, said regions defining a channel therebetween;
    a first oxide layer disposed over said channel;
    an electrically floating, polycrystalline silicon gate disposed over said channel and insulated from said channel by said first oxide layer;
    a third n-type region in said substrate contiguous with said second region;
    a second oxide layer 70 Å to 200 Å thick disposed over at least a portion of said third region;
    said floating gate extending over said portion of said third region and insulated from said third region by said second oxide layer;
    a second conductive gate disposed above and insulated from said floating gate;
    whereby, by the application of a positive potential to said second gate, charge is tunneled from said third region into said floating gate through said second oxide layer, and whereby, by the application of a positive potential to said second region, charge is tunneled from said floating gate through said second oxide layer to said third region.

10. The device defined by claim 9 wherein said second gate extends beyond the edges of said floating gate at said portion of said third region.

11. The MOS memory device defined by claim 10 wherein said third region is an ion implanted region.

12. The MOS memory device defined by claim 10 wherein said third region is an arsenic implanted region.

13. The MOS memory device defined by claim 12 wherein said first region is also a source region for a field-effect transistor used to select said memory device.

14. The MOS memory device defined by claim 10 wherein said second oxide layer is approximately 100 Å thick.

15. The MOS memory device defined by claim 14 wherein said first oxide layer is 500 Å–1000 Å thick.

16. The MOS memory device defined by claim 15 wherein said second gate is a polycrystalline silicon gate.

* * * * *

UNITED STATES PATENT AND TRADEMARK OFFICE
CERTIFICATE OF CORRECTION

PATENT NO. : 4,203,158
DATED : May 13, 1980
INVENTOR(S) : Dov Frohman-Bentchkowsky, Jerry Mar, George Perlegos and William S. Johnson It is certified that error appears in the above-identified patent and that said Letters Patent are hereby corrected as shown below:

| COLUMN | LINE | |
|--------|------|---|
| 10 | 8 | Delete "thin", insert --third--. |

Signed and Sealed this

Eighth Day of December 1981

[SEAL]

Attest:

GERALD J. MOSSINGHOFF

Attesting Officer     Commissioner of Patents and Trademarks

REEXAMINATION CERTIFICATE (1799th)

United States Patent [19]
Frohman-Bentchkowsky et al.

[11] B1 4,203,158
[45] Certificate Issued Sep. 22, 1992

[54] ELECTRICALLY PROGRAMMABLE AND ERASABLE MOS FLOATING GATE MEMORY DEVICE EMPLOYING TUNNELING AND METHOD OF FABRICATING SAME

[75] Inventors: Dov Frohman-Bentchkowsky, Haifa, Israel; Jerry Mar, Sunnyvale, Calif.; George Perlegos, Cupertino, Calif.; William S. Johnson, Palo Alto, Calif.

[73] Assignee: Intel Corporation, Santa Clara, Calif.

Reexamination Request:
No. 90/002,503, Nov. 7, 1991

Reexamination Certificate for:
Patent No.: 4,203,158
Issued: May 13, 1980
Appl. No.: 969,819
Filed: Dec. 15, 1978

Certificate of Correction issued Jun. 1, 1984.

Related U.S. Application Data

[63] Continuation-in-part of Ser. No. 881,029, Feb. 24, 1978, abandoned.

[51] Int. Cl.⁵ ............................................. G11C 11/40
[52] U.S. Cl. ..................................... 365/185; 357/41; 307/482.1
[58] Field of Search ....................... 365/185; 307/482.1

[56] References Cited

U.S. PATENT DOCUMENTS 4,115,914  9/1978  Harrari .
4,203,158  5/1980  Frohman-Bentchkowsky et al. ........................ 365/185

OTHER PUBLICATIONS

Stipulation of Withdrawal of GI, Microchip and GI Arizona's Motion for Summary Judgment of Invalidity of Intel's U.S. Pat. No. 4,203,158.
General Instrument, Microchip and GI Arizona's Memorandum in Support of Their Motion for Summary Judgment of Invalidity of Intel's U.S. Pat. No. 4,203,158 Pursuant to 35 U.S.C.§102(e).
Anticipation of Claims 1, 2, 3, 5, 6, 7 and 9 of Intel's '158 Patent By '914 Patent to Harrari (Exhibit N).
Intel Corporation's Responses to General Instrument's Third Set of Request for Admission (Exhibit M).

Primary Examiner—Terrell W. Fears

[57] ABSTRACT

An electrically programmable and electrically erasable MOS memory device suitable for high density integrated circuit memories is disclosed. Carriers are tunneled between a floating conductive gate and a doped region in the substrate to program and erase the device. A minimum area of thin oxide (70 Å–200 Å) is used to separate this doped region from the floating gate. In one embodiment, a second layer of polysilicon is used to protect the thin oxide region during certain processing steps.

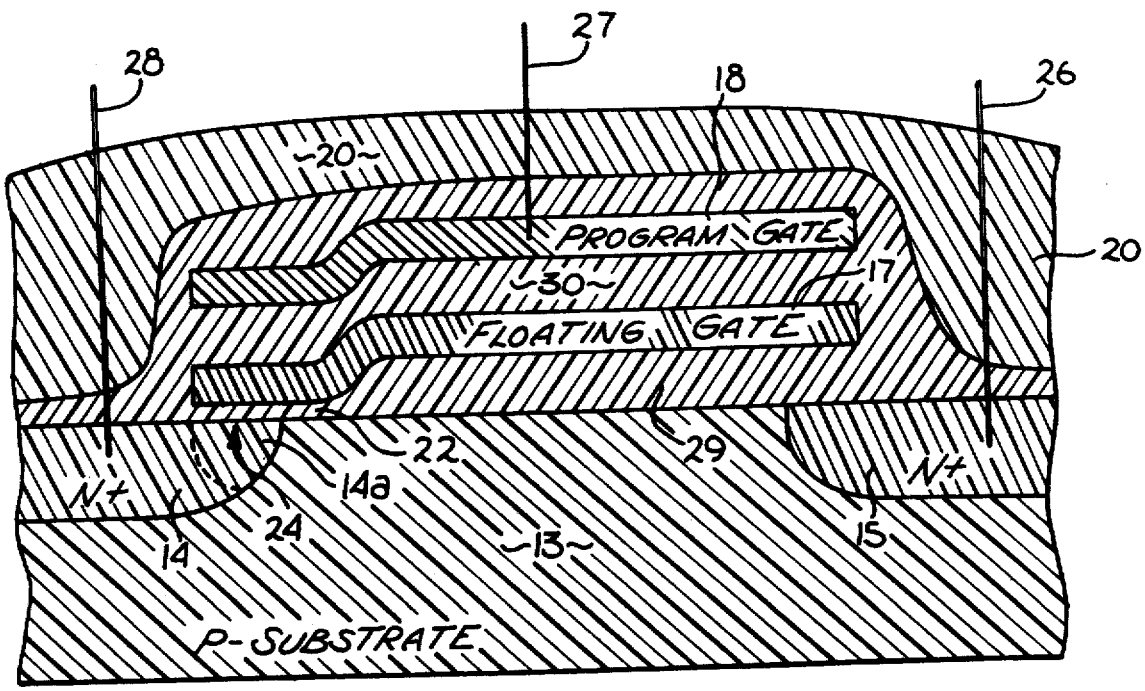

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 8 and 10 are cancelled.

Claims 1, 9, 11, 12 and 14 are determined to be patentable as amended.

Claims 2–7, 13 and 15, 16, dependent on an amended claim, are determined to be patentable.

1. An electrically programmable and electrically erasable MOS memory device comprising:
a substrate of a first conductive type;
first and second spaced-apart regions in said substrate of a second conductivity type;
an electrically floating, conductive gate disposed generally between said spaced-apart first and second regions;
a first insulative layer insulating said floating gate from said substrate;
a third region in said substrate of said second conductivity type;
said floating gate extending over said third region and insulated from said third region by a second insulative layer which is 70 Å to 200 Å thick;
a second gate disposed above and *extending beyond the edges of said floating gate at said third region, said second gate* insulated from said floating gate;
whereby, by the application of a first potential to said second gate, carriers are tunneled through said second insulative layer from said third region into said floating gate, and whereby, by the application of a second potential of the same polarity as said first potential to said third region, carriers are tunneled through said second insulative layer from said floating gate to said third region.

9. An MOS memory device fabricated on a p-type silicon substrate comprising:
a first and second spaced-apart, n-type region in said substrate, said regions defining a channel there between, *said second region defining a laterally extending finger;*
a first oxide layer disposed over said channel;
an electrically floating, polycrystalline silicon gate disposed over said channel and insulated from said channel by said first oxide layer, *said floating gate extending across said finger;*
a third n-type region in said substrate contiguous with said second region;
a second oxide layer 70 Å to 200 Å thick disposed over at least a portion of said third region;
said floating gate extending over said portion of said third region and insulated from said third region by said second oxide layer;
a second conductive gate disposed above and insulated from said floating gate *and extending beyond the edges of said floating gate at said third region, said second gate extending across said finger;*
whereby, by the application of a positive potential to said second gate, charge is tunneled from said third region into said floating gate through said second oxide layer, and whereby, by the application of a positive potential to said second region, charge is tunneled from said floating gate through said second oxide layer to said third region.

11. The MOS memory device defined by claim [10] *9* wherein said third region is an ion implanted region.

12. The MOS memory device defined by claim [10] *9* wherein said third region is an arsenic implanted region.

14. The MOS memory device defined by claim [10] *9* wherein said second oxide layer is approximately 100 Å thick.

* * * * *